United States Patent
Dinoi et al.

(10) Patent No.: US 7,568,145 B2
(45) Date of Patent: Jul. 28, 2009

(54) PRUNABLE S-RANDOM INTERLEAVERS

(76) Inventors: Libero Dinoi, Via per Carlo Boggio 61 (Passo Carraio), Torino (IT) I-10138; Sergio Benedetto, Corso Duca Degli Abruzzi 24, Torino (IT) I-10129

( * ) Notice: Subject to any disclaimer, the term of this patent is extended or adjusted under 35 U.S.C. 154(b) by 483 days.

(21) Appl. No.: 11/106,474

(22) Filed: Apr. 15, 2005

(65) Prior Publication Data
US 2006/0123309 A1 Jun. 8, 2006

(30) Foreign Application Priority Data
Apr. 15, 2004 (IT) ................................. 04425273

(51) Int. Cl.
*H03M 13/00* (2006.01)
(52) U.S. Cl. ........................ 714/762; 714/788
(58) Field of Classification Search ................. 714/755, 714/762, 788, 701
See application file for complete search history.

(56) References Cited

U.S. PATENT DOCUMENTS 7,020,827 B2 * 3/2006 Gatherer et al. ............. 714/786

2002/0138806 A1 * 9/2002 Scalise et al. ............... 714/786
2003/0033565 A1 * 2/2003 Crozier et al. .............. 714/701
2003/0221084 A1 * 11/2003 Zhou .......................... 711/209
2008/0065948 A1 * 3/2008 Eroz et al. ................... 714/752

FOREIGN PATENT DOCUMENTS

EP    1 257 064 A1    11/2002

OTHER PUBLICATIONS

M. Ferrari, F. Scalise, S. Bellini, "Prunable S-random Interleavers", in Proc. IEEE Conf. Communications, vol. 3, 2002, pp. 1711-1715.

* cited by examiner

*Primary Examiner*—Guy J Lamarre
(74) *Attorney, Agent, or Firm*—Perkins Coie LLP

(57) ABSTRACT

A system, method and machine-readable medium for pruning an S-random interleaver starting with an interleaver permutation having N elements and alternating between invalidating the last element of the interleaver permutation and invalidating the last element of a corresponding inverse interleaver permutation until the interleaver permutation has K elements, K being less than N, the method being characterized by the use of a reference vector having N flags and comprising: storing a value in an element of the reference vector corresponding to the value of the each element invalidated in the interleaver permutation.

32 Claims, 3 Drawing Sheets

PRUNABLE S-RANDOM INTERLEAVERS

BACKGROUND OF THE INVENTION

The present invention relates generally to coding systems for digital communications, and particularly to pruning methods for the obtention of S-random interleavers with a reduced size starting from an initial S-random interleaver having a larger size.

In the present description, following an already established practice in this field, by "interleaver" it is meant the "interleaver permutation" or "interleaver law" associated with an interleaver device in the proper sense of the word.

Interleavers play a crucial role in systems using turbocodes.

Interleavers of the S-random type represent, as it is well-known, an optimum class of interleavers, and differently from many other permutation systems, are sufficiently robust with respect to the specific convolutional codes employed and to the puncturing rate applied to the overall code.

Many application systems require a great flexibility in terms of block length and code-rate, and the change of these parameters involves a corresponding modification of the interleaver size. In such cases, it is highly recommendable to obtain, by use of an algorithm, all the needed interleavers from a mother interleaver which exhibits the largest size, avoiding the need to store all the necessary permutation laws.

Unfortunately the known pruning techniques disclosed in the literature generally destroy the properties of S-random interleavers.

A pruning method is disclosed in EP 1 257 064 A and in M. Ferrari, F. Scalise, S. Bellini, "Prunable S-random Interleavers", in Proc. IEEE Conf. Communications, Vol. 3, 2002, pages 1711-1715.

The pruning method disclosed in said documents provides for discarding all the elements of an initial interleaver which have a value greater than the size of the desired smaller interleaver. That technique allows to store one single interleaver and for the larger interleavers it affords (only) the same spread properties of the smaller interleaver.

SUMMARY OF THE INVENTION

It is an object of the present invention to propose a pruning method of the initially specified kind, which allows to overcome the limitations of the above-outlined prior art, permitting to obtain in general S-random interleavers with improved spread properties.

It can be shown, in an intuitive manner, and by means of simulations and tests, that the pruning method according to the present invention reduces in a quite less dramatic way the spread properties of the shorter interleavers, the pruning method being suitable for employment with a by far wider range of block sizes or lengths, differently from what was possible with the conventional pruning techniques.

In the following, different variants of the basic pruning methods will be also disclosed, each variant corresponding to a different trade-off between complexity, latency and memory requirements.

The invention also relates to interleaver devices which carry out the above-outlined pruning methods.

BRIEF DESCRIPTION OF THE DRAWINGS

Further characteristics and advantages of the invention will become apparent from the detail description which follows, provided merely as a non-limiting example, with reference to the enclosed drawings in which.

DETAILED DESCRIPTION OF THE INVENTION

Figure 1:
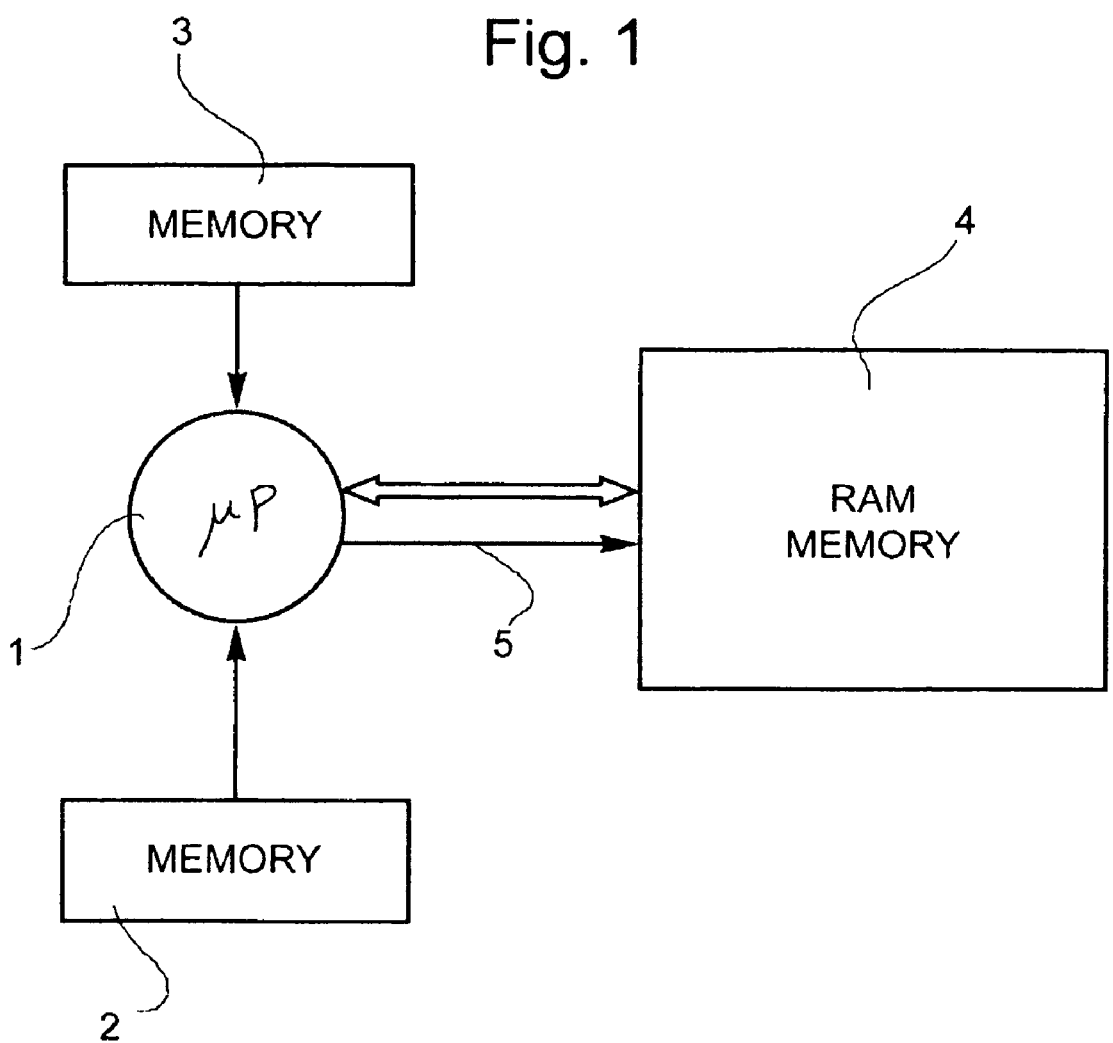
FIG. 1 is a block diagram of an apparatus which can be used for carrying out a pruning method according to the present invention.

The pruning methods according to the invention provide better results with respect to conventional techniques, for every S-random type interleaver. However, these methods provide optimal results if applied to S-random interleavers obtained with a progressive technique of permutation generation invented by the same inventors of this application, which will be now presented herebelow.

In European patent application EP 1 257 064 A there was proposed an algorithm for the generation of S-random interleavers or, better stated, interleaver permutations, which, starting from a good S-random interleaver permutation of size K and spread S, creates, by extension, a larger or longer interleaver permutation, say of size N, with the same spread properties of the starting interleaver permutation. Although this may be sufficiently acceptable for a small range of interleaver sizes, this constraint may lead to poor results if one has to construct interleavers in a wide range of sizes, as this leads to poor spreading properties of the larger interleavers.

The incremental technique which will be now presented overcomes this limitation. While the algorithm according to the prior art in fact extracts at random an integer representing the position of the new element which is added to the interleaver, the technique which will be now described picks a number from a subset of positions that allows to improve the spread properties.

If we start from a K-sized interleaver with a spread S, the next step in the extension process is to add new positions until we reach a spread S+1. Thus we analyze the permutation and see which pairs of positions [i;j] and [Π(i);Π(j)] correspond to the violations that do not permit to reach a spread equal to S+1.

One easy way to overcome these violations is to choose an element with Π(K+1)=ψ, ψ∈[min(Π(i), Π(j))+1; max(Π(i), Π(j))], and then update all previous K elements or positions of the interleaver by incrementing of one all those greater than or equal to ψ.

To eliminate or break, at each step, the maximum number of violations, an interval vector A is created, which contains all position pairs causing violations of the spread properties. Each pair defines an interval, whose internal numbers are suitable for extraction; then we can use the vector A to build a second vector, defined as the position vector B, which is proportional to the attitude of each position to break spread violations.

The vector B is then sorted in descending order and the first element that does not introduce new spread violations is extracted.

This technique permits to improve the spread properties in a very fast way, and to construct interleavers with large sizes having very good spreading properties with a computational complexity that may be competitive even with the direct S-random interleaver generation.

The improved method for the construction of interleavers described above can be performed essentially by the algorithm disclosed herebelow in a pseudo-code formalism:
starting from an interleaver permutation Π having a size or length K and a spread $S_{in}$:
   Set dim=K and S=$S_{in}$
   LOOP UNTIL dim=N
     if dim is even
       build the interval vector A with the (S+1) spread violations; the intervals are [min(Π(i), Π(j))+1; max (Π(i), Π(j))]
       build the position vector B
       pick ψ from B, such that it does not introduce new spread violations
       set Π(dim+1)=ψ
       ∀k≦dim, if Π(k)≧ψ, set Π(k)=Π(k)+1
       obtain the inverse interleaver $Π^{-1}$
     if dim is odd
       build the interval vector A with the (S+1) spread violations; the intervals are [min(i,j)+1; max(i,j)]
       build the position vector B
       pick ψ from B, such that it does not introduce new spread violations
       set $Π^{-1}$(dim+1)=ψ
       ∀k≦dim, if $Π^{-1}$(k)≧ψ, set $Π^{-1}$(k)=$Π^{-1}$(k)+1
       obtain the interleaver Π
     set dim=dim+1
     if there are no more (S+1) spread violations set S=S+1
   END OF LOOP The algorithm above allows to yield a wide range of interleavers with different sizes with good spreading properties.

When the system at hand needs to obtain one of them "on the fly", an easily implementable pruning algorithm is required.

For instance, this means that new elements have to be inserted into the interleaver permutation in a way that allows to know their position and discard them very easily.

According to the prior method disclosed in EP 1 257 064 A, this can be obtained for instance starting from a created N-sized interleaver and removing its last N-K positions. This, in turn, requires to use the elements of the position vector B to choose the elements Π(K+i), i=1, ..., N-K. That is in fact the pruning rule suggested in EP 1 257 064 A, and it complies very well with the therein aimed criterion of preserving for the extended interleavers the same spread properties of the shortest interleaver. On the contrary, it has serious drawbacks in other cases and in particular when applied to interleavers having an interleaver permutation or an interleaver law obtained by means of the innovative technique described above or the algorithm presented above.

As it will be readily apparent form the following, the pruning method according to the present invention allows to obtain, starting from an initial S-random interleaver permutation stored in memory means and having a size N, i.e. formed of N elements, a final S-random permutation having a smaller size K<N, i.e. formed of K elements, by means of successive pruning operations or steps which, starting from the initial permutation, yield the final permutation through an iterative process carried out by means of electronic processing means with memory. In successive steps of said iterative process elements selected on the basis of predetermined criteria are discarded from the initial permutation.

In particular, in the method according to the invention the final permutation is generated by utilizing a reference vector having a size equal to that of the initial permutation and thus comprising N elements; said reference vector being generated by said processing means in such a way that at each pruning step if the element discarded from the initial permutation has been eliminated on the basis of a predetermined criterion, one element of said reference vector is generated such that its value and its position in the reference vector are indicative of the value of the elements discarded from the initial permutation.

The method according to the invention can be performed in different variants, which will be described in a more detailed way in the following, to reduce the size of a large initial interleaver, named afterwards $Π_0(x)$, that is stored in a read-only memory (ROM), to obtain a shorter one, named $Π_n(x)$, that is stored in a reserved random-access memory (RAM) area.

A good number of methods according to the invention are in general composed by three tasks:
   identification of the elements to be pruned,
   re-normalization, namely re-definition (scaling) of the value of part of the valid or surviving elements, and
   re-compacting of the interleaver.

The basic pruning method according to the invention as defined above can be carried out for instance by means of the apparatus shown in FIG. 1, which comprises a microprocessor 1 with associated memory devices 2 and 3. The memory devices indicated 2 are of the read-only (ROM) kind and serve to store the N-sized initial or start interleaver $Π_0$ and, possibly, its inverse $Π_0^{-1}$, whereas the memory devices 3 can be either of the read-only (ROM) type or of the random-access (RAM) type and serve to store the reference or auxiliary vector(s), described in the following, and the final interleaver $Π_n$.

The microprocessor 1 is coupled to random-access memory (RAM) devices 4 through an address line 5. Said memory devices are used for implementing the algorithm for decoding the turbo-codes. Said algorithm is based on the iterative performance of a variant of the so-called BCJR algorithm by so-called SISO (Soft Input Soft Output) units: in the case of only two constituent convolutional codes, each iteration is composed of two half-iterations, in the first one of which the data are written and read in natural order from memory 4, and in the second one of which data are written and read in the order determined by the interleaver permutation or interleaver law.

In the pruning methods according to the invention, in those steps which we conventionally define as "odd" steps, i.e. the steps at which a pruning operation is made onto a permutation having an odd size, the elements of the interleaver which have the highest values are discarded, whereas in those steps which we conventionally define as "even" steps, i.e. the steps in which a pruning operation is made onto an interleaver permutation having an even size, the elements having the highest position indices, namely the last elements of the permutation, are eliminated.

Figure 2:
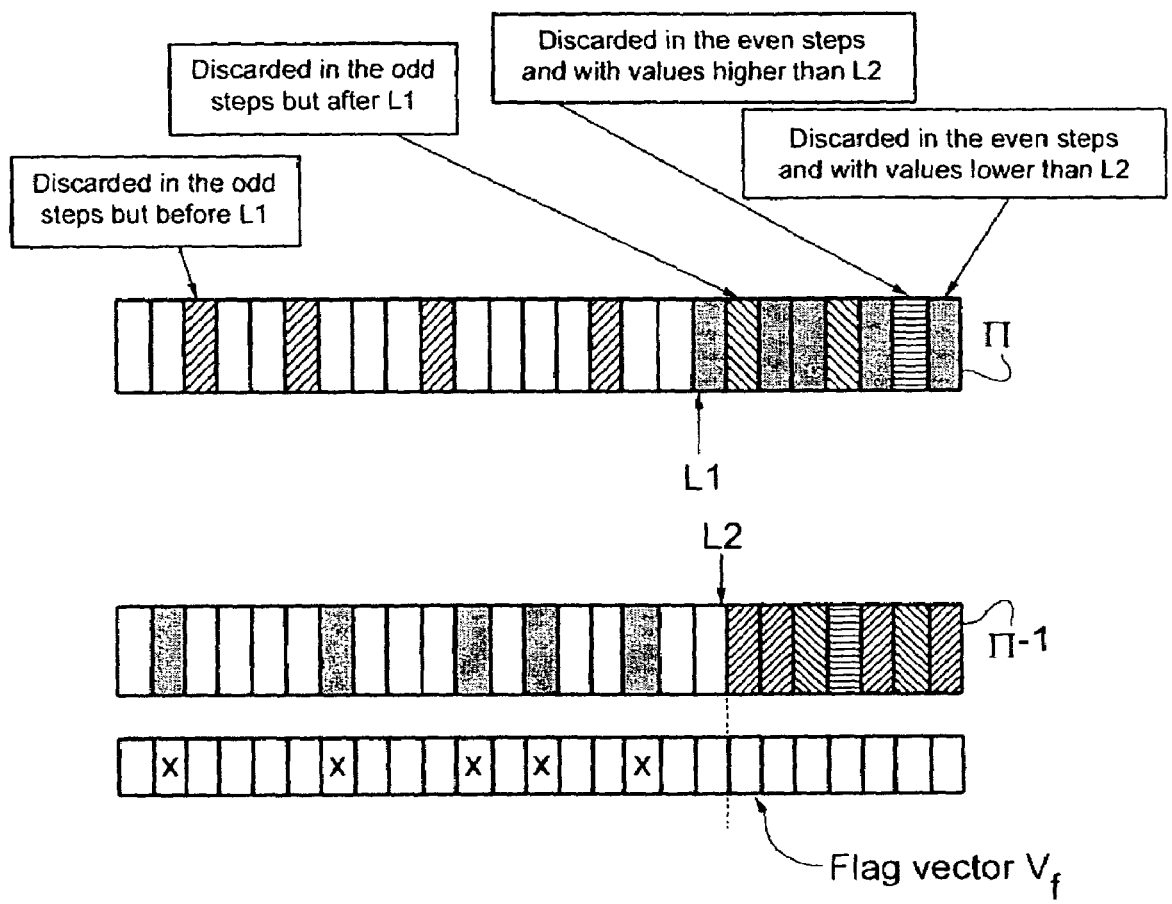
FIG. 2 is diagrammatic graphic representation of a start interleaver permutation and the corresponding inverse permutation as well as an associated reference (flag) vector generated in performing a pruning method according to the present invention.

For a better understanding of the following remarks reference can be made to FIG. 2 which gives a graphic representation of an initial interleaver permutation, indicated Π, formed of 25 elements, and, therebelow, a representation of the corresponding inverse permutation $Π^{-1}$.

At the end of the pruning process of the invention, as shown in FIG. 2, all the values discarded in the even steps and some of those deleted in the odd steps will form an end or tail group of consecutive deleted elements, while the other eliminated values will be scattered on the rest of the permutation. The pruned elements are distributed in a similar pattern also in the inverse interleaver $Π^{-1}$.

The thresholds which separate the end or tail groups of consecutive discarded elements in the permutation Π and in the inverse permutation $\Pi^{-1}$, respectively, are denoted as L1 and L2.

In various pruning methods according to the invention the main source of complexity lies in the re-normalization and re-compacting operations performed in the innermost loops. It is possible to decrease the number of required operations avoiding to perform the above-mentioned operations for each deleted element.

This can be done by keeping track of the deleted elements updating the thresholds L1 and L2, and building a reference or flag vector $V_f$, which has been graphically represented by way of example in FIG. 2.

The flag vector $V_f$ has a size N and comprises N binary elements or flags assuming each a predetermined value or state (set to "1", for instance) when their position corresponds to the value of an element discarded from the initial permutation Π as being placed at the last position of a permutation of odd size. Such 'set' elements or flags of vector $V_f$ have been indicated "x" in the representation of FIG. 2.

The values of the thresholds L1 and L2, and the flag vector $V_f$, obtained in a first phase of the pruning method, can be conveniently used in a second and a third phase for performing the re-normalisation of surviving or remaining elements of the permutation. This allows to lower significantly the overall computational complexity.

In the following some techniques will be described, which rely on these principles, but differing in the way they exploit the flag vector $V_f$. A preliminary remark is necessary to analyze the average complexity of said techniques: when pruning an N-sized interleaver to obtain a K-sized one, the threshold L1 and L2 can be approximated as:

$$L1=L2=\sqrt{KN} \qquad (1)$$

Algorithm A

A first embodiment of the general method of the invention, that we will call now onward "Algorithm A", is composed essentially of three main cycles.

In the first cycle, the flag vector $V_f$ is computed and the thresholds L1 and L2 are updated:
Set dim=N−1, L1=L2=N
LOOP UNTIL dim<K
if dim is even:
   Set L1=L1−1
   LOOP UNTIL $\Pi_0$ (L1)<L2
   Set L1=L1−1
   END OF LOOP
   Set $V_f(\Pi_0$ (L1))=1
if dim is odd:
   Set L2=L2−1
   LOOP UNTIL $V_f$(L2)=0
   Set L2=L2−1
   END OF LOOP
Set dim=dim−1
END OF LOOP In the second cycle, after the permutation $\Pi_0$ is copied to $\Pi_n$, the positions of the latter vector are re-normalized with the help of the de-interleaver $\Pi_0^{-1}$ and of the flag vector $V_f$.
Copy the first L1 positions of $\Pi_0$ to $\Pi_n$
Set the number of positions to be discarded DP=L2−K and i=L2−1
LOOP UNTIL DP=0
if $V_f$(i) is set, set DP=DP−1 or else decrease $\Pi_n(\Pi_0^{-1}$(i)) by DP
Set i=i−1
END OF LOOP Scanning the interleaver as described here is equal to scan it starting from the elements with the highest values and ending with the elements with the lower values.

Finally, in the third cycle, the permutation $\Pi_n$ is re-compacted by eliminating all the elements whose value exceeds K, or, equivalently, L2:
Set cnt=0 and i=0
LOOP UNTIL i=L1
if $\Pi_n(i)$<L2 set $\Pi_n(cnt)=\Pi_n(i)$ and cnt=cnt+1
Set i=i+1
END OF LOOP The complexity of the algorithm A can as a whole be approximated as:

$$C=3N+3K+2\sqrt{KN} \qquad (2)$$

Algorithm B

A variant of the basic method of the invention, defined "Algorithm B" in the following, applies the same principles of the previous one (Algorithm A), but gets rid of the de-interleaver. The re-normalization step is performed with relatively low complexity, exploiting the computations already performed for the closest previous elements.

In fact, the re-normalization is performed decreasing the value of the i-th element of $\Pi_0$ by a number equal to the number of "set" flags contained in $V_f$ before the index $\Pi_0(i)$. In this case for every of the K elements of the pruned interleaver, one should scan the flag vector $V_f$ for $\Pi_0(i)$ positions.

Alternatively, if D is an integer greater than zero and lesser than N, we can find amongst the D previously updated elements the one, with index $i_D$, such that $\Pi_0(i_D)$ is closest to $\Pi_0(i)$. Then the flag vector is to be scanned only for a number of positions equal to the difference between $\Pi_0(i_D)$ and $\Pi_0(i)$, and decrease the current element of the number of flags in the said interval and of the difference between $\Pi_0(i_D)$ and $\Pi_n(i_D)$ Therefore, firstly one has to obtain the thresholds L1 and L2 and the flag vector $V_f$, as in the first cycle of the Algorithm A, and then the first L1 elements of $\Pi_0$, as in the second cycle of the Algorithm A. Then $\Pi_n$ is re-normalized:
Set i=0
LOOP UNTIL i=L1
If $\Pi_n(i)$<L2 find in the D previous elements the $i_D$-th element such that $\Pi_0(i_D)$<L2 and that the difference $\Delta=\Pi_0(i_D)-\Pi_0(i)$ is minimum.
Set $N_f$=0
if Δ>0
   if Δ>$\Pi_0(i)$, count $N_f$ i.e the number of flags in $V_f$ in the interval [0; $\Pi_0(i)$] and set $\Pi_n(i)=\Pi_n(i)-N_f$
   if Δ≦$\Pi_0(i)$, count $N_f$, the number of flags in $V_f$ in the interval [$\Pi_0(i)$; $\Pi_0(i)+\Delta$] and set $\Pi_n(i)=\Pi_n(i)+N_f+\Pi_n(i_D)-\Pi_0(i_D)$
if Δ<0
   if −Δ>L2−$\Pi_0(i)$, count $N_f$ i.e. the number of flags in $V_f$ in the interval [$\Pi_0(i)$; L2] and set $\Pi_n(i)=\Pi_n(i)+N_f+K-L2$
   if −Δ≦L2−$\Pi_0(i)$, count $N_f$, the number of flags in $V_f$ in the interval [$\Pi_0(i)+\Delta$; $\Pi_0(i)$] and set $\Pi_n(i)=\Pi_n(i)-N_f+\Pi_n(i_D)-\Pi_0(i_D)$
Set i=i+1
END OF LOOP Finally, in the third cycle the re-compacting step is performed as already previously described. The overall complexity of this variant of the method can be approximated as:

$$C = \frac{KN}{2(1+D)} + 2KD + 3N + 3K + 2\sqrt{KN} \qquad (3)$$

Unlike Algorithm A, this variant does not need the de-interleaver $\Pi_0^{-1}$ so a memory of 2N is required.

Algorithm C

This variant of the method according to the invention has a complexity that can be lowered to that of Algorithm A by trading-off a small quantity of additional memory. In the previous variant (Algorithm B) the re-normalization step is performed exploiting the information implicitly present in the updated values of the neighbouring elements. In this variant, defined Algorithm C, we construct a small vector of (NP) elements (with P<<1) named $V_p$: the vector $V_p(i)$ contains the number of flags set in $V_f$ in the interval $[0; i(1+\lfloor L2/(NP)\rfloor)]$, where $\lfloor x \rfloor$ is the integer part of x. Then the flag vector $V_f$ has to be scanned, for each of the K elements of the pruned interleaver, in the worst case for L2/NP elements.

Then, as in the preceding two algorithms, we have to obtain the thresholds L1 and L2 and the flag vector $V_f$ and to copy to $\Pi_n$ the first L1 elements of $\Pi_0$.

Thereafter in the second cycle we construct the vector $V_p$:
Set i=0 and $N_f$=0
LOOP UNTIL i=L2
if $V_f(i)$=1 set $N_f$=$N_f$+1
if $(1+\lfloor L2/(NP)\rfloor)$ divides i, set $V_p(i/(1+\lfloor L2/(NP)\rfloor))=N_f$
Set i=i+1
END OF LOOP In the successive cycle, the vectors $V_p$ and $V_f$ are exploited to perform the re-normalization step:
Set i=0
LOOP UNTIL i=L1
Set $N_f$=0
If $\Pi_n(i)$<L2
  Compute k=$\Pi_n(i)/(1+\lfloor L2/(NP)\rfloor)$ and round it to the nearest integer m
  if m=NP, set m=m−1
  if k≧m, compute the number of flags $N_f$ in $V_f$ in the interval $(m(1+\lfloor L2/(NP)\rfloor); \Pi_0(i))$ and set $\Pi_n(i)=\Pi_n(i)-N_f-V_p(m)$
  if k≦m, compute the number of flags $N_f$ in $V_f$ in the interval $(\Pi_0(i); m(1+\lfloor L2/(NP)\rfloor))$ and set $\Pi_n(i)=\Pi_n(i)+N_f-V_p(m)$
Set i=i+1
END OF LOOP In the last loop the usual recompaction steps are carried out.

The overall average complexity of the algorithm C is $$C = \frac{K\sqrt{KN}}{2NP} + 3N + 3K + 3\sqrt{KN} + NP \qquad (4)$$

The total memory required by this algorithm amounts to (2+P)N; it is easy to deduce from the above expression of the complexity that if P is increased, i.e. if the memory requirements grow, the complexity becomes lower.

Algorithm D

If extra cycles, i.e. operations of reading non-valid elements of the initial permutation, are tolerated, the traditional pruning method according to EP 1 257 064 A requires no beforehand computations but only to compare every element of the original interleaver with the new interleaver size. While in the first semi-iteration the SISO module reads and writes data following the natural order of the addresses from the first K positions of the memory device, in the second half-iteration the data are read and written from the said memory device in the order determined by the interleaver and in that phase every element of the initial permutation greater than K is ignored. Clearly, no RAM is required. Since the elements to be discarded are scattered on the whole length of the interleaver, in the worst case all the interleaver has to be scanned in order to perform interleaving.

In a first variant of the method according to Algorithm C, denoted as Algorithm D, only the steps necessary to obtain L1,L2 and the vector $V_f$ are performed, and, while computing $V_f$, also the positions discarded in the odd steps are considered. Thus the elements of the flag vector $V_f$ take a predetermined value (for instance set to "1") when their position corresponds to the value of an element discarded from the initial permutation. In the first semi-iteration the SISO module reads and writes data following the natural order of the addresses avoiding the i-th position if $V_f(i)$ is "flagged". Similarly, in the second semi-iteration the data are read and written in the order of the initial permutation, avoiding the $\Pi_0(i)$-th address if the corresponding element $V_f(\Pi_0(i))$ is "flagged".

It is not necessary to scan the interleaver in its entire length, because, as previously explained, the last elements are discarded, so the number of extra-cycles is somewhat reduced, with respect to the previous case.

Algorithm E

A further variant of the method defined above as Algorithm C, here denoted as Algorithm E, avoids the computations each time necessary to obtain the flag vector $V_f$, using a vector of N integers, named $V_{aux}$, stored in a ROM and containing the same information of $V_f$. For each flag set to 1, we store the step, i.e. the interleaver size or length, during which that position was flagged, so that, when writing/reading in natural (scrambled) order, the i-th address is discarded if $V_{aux}(i)$ is greater than K, and, similarly, when writing/reading in scrambled order, the $\Pi_0(i)$-th address is discarded if $V_{aux}(\Pi_0(i))$ is greater than K.

We can now summarize the characteristics of the different pruning techniques that we have described so far. Their complexity and their memory requirements are summarised in the following Table.

| PRUNING METHOD | COMPLEXITY | RON Integers | RAM Integers | RAM Bits | Extra-cycles |
| --- | --- | --- | --- | --- | --- |
| EP 1 257 064 A | N + K | N | N | 0 | 0 |
| Algorithm A | $3N + 3K + 2\sqrt{KN}$ | 2N | N | N | 0 |

-continued

| PRUNING METHOD | COMPLEXITY | RON Integers | RAM Integers | RAM Bits | Extra-cycles |
|---|---|---|---|---|---|
| Algorithm B | $3N + 3K + 2\sqrt{KN} + 2\,kD + \dfrac{kN}{2(1+D)}$ | N | N | N | 0 |
| Algorithm C | $3N + 3K + 2\sqrt{KN} + NP + \dfrac{K\sqrt{KN}}{2NP}$ | N | $(1+P)N$ | N | 0 |
| EP 1 257 064 A | 0 | N | 0 | 0 | $N - K$ |
| Algorithm D | $\dfrac{7N}{2} - \dfrac{3K}{2} - 2\sqrt{KN}$ | N | 0 | N | $\sqrt{KN} - K$ |
| Algorithm E | 0 | 2N | 0 | 0 | $\sqrt{KN} - K$ |

Figure 3:
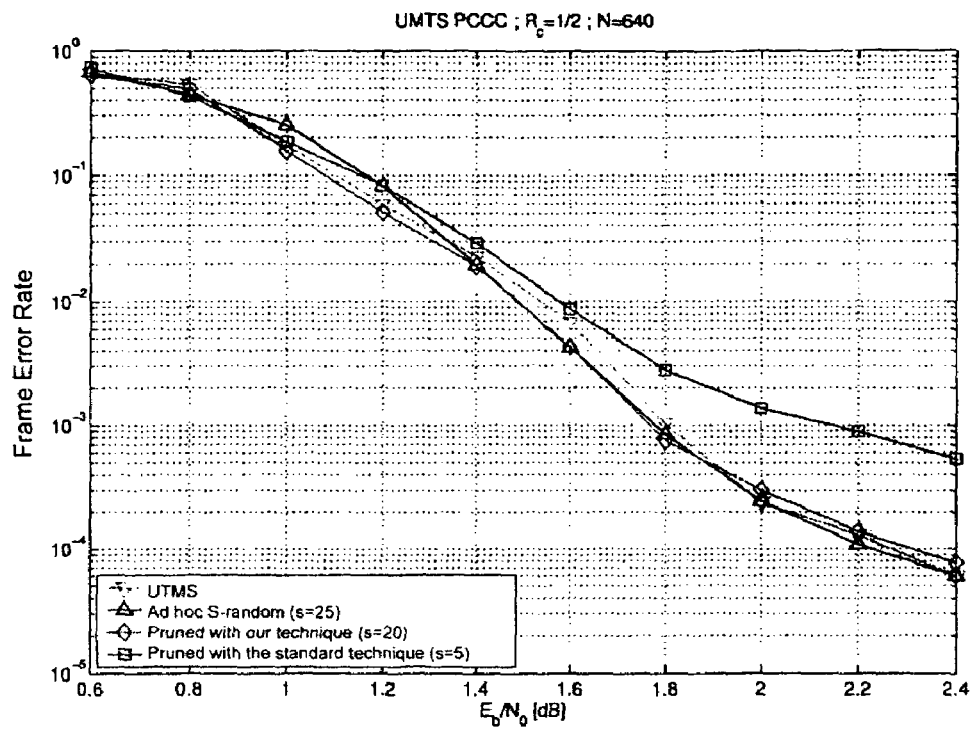
FIGS. 3 and 4 show diagrams comparing the performances of interleavers obtained through the method or process according to the invention, with interleavers according to the prior art.

In the diagram shown in FIG. 3, which illustrates the frame error rate (FER) as a function of $E_b/N_0$, where $E_b$ is the energy per bit and $N_0$ is the spectral density of the Gaussian white noise, there are compared the characteristics of two S-random interleavers having a length of 640, obtained starting from an S-random interleaver generated by a standard technique with a length of 32768 and a spread S=195, with a standard pruning technique and with the new method, with an interleaver specially designed for that same length, and with the interleaver proposed by the UMTS standard.

Figure 4:
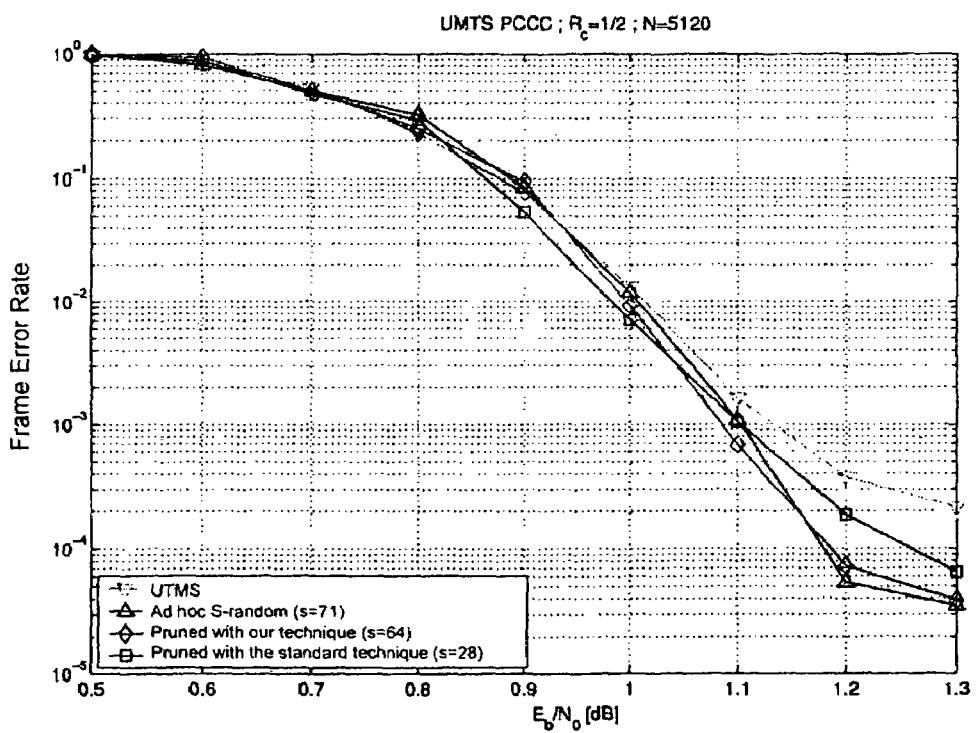

Similarly, in FIG. 4 there are compared the features of two S-random interleavers of length 5120 obtained starting from an S-random interleaver generated by the standard technique, with a length of 32768 and a spread S=195, with the standard pruning technique and the new method, with an interleaver specially designed for that length and with the interleaver proposed by the UMTS standard.

Naturally, the principle of the invention remaining the same, the form of embodiment and the particulars of construction can be widely modified with respect to what has been described and illustrated by way of non-limiting example, without departing from the scope of the invention as defined in the annexed claims.

What is claimed is:

1. A method of pruning an S-random interleaver starting with an interleaver permutation having N elements and alternating between invalidating the last element of the interleaver permutation and invalidating the last element of a corresponding inverse interleaver permutation until the interleaver permutation has K elements, K being less than N, the method comprising storing a value in an element of the reference vector corresponding to the value of the each element invalidated in the interleaver permutation, the reference vector having N elements.

2. The method of claim 1 further comprising:
updating a first threshold position indicating the last valid element of the interleaver permutation as elements of the interleaver permutation are invalidated;
updating a second threshold value indicating the last valid element of the inverse interleaver permutation as elements of the inverse interleaver permutation are invalidated; and
wherein storing a value in an element of the reference vector corresponding to the value of the each element invalidated in the interleaver permutation comprises setting a flag.

3. The method of claim 2 further comprising normalizing the interleaver permutation using the reference vector, wherein the process of normalizing the interleaver permutation comprises:
selling DP equal to the number of elements to be discarded;
scanning the inverse interleaver permutation starting from the last valid element until DP=O, for each i, where i is an index of the elements of the reference vector, such that if the corresponding element of the reference vector is set:
subtracting DP from the element of the interleaver permutation addressed by the value of the inverse interleaver permutation indexed by i; and
decrementing DP by 1.

4. The method of claim 2 further comprising compacting the interleaver permutation, wherein the process of compacting the interleaver permutation comprises discarding elements of the interleaver permutation having a value greater than K.

5. The method of claim 2 further comprising normalizing the interleaver permutation using the reference vector, wherein the process of normalizing the interleaver permutation comprises, for each element of the interleaver permutation, decreasing the value of the i-th element of the interleaver permutation by the number of set flags in the first i flags of the reference vector, wherein i is an index of the elements of the reference vector.

6. The method of claim 5 wherein the number of set flags in the first i flags of the reference vector is determined in part by determining a first number of flags set, the first number of flags set being the number of flags set in the first iD flags of the reference vector, where iD is the index of the element of the interleaver permutation having the closest value to the value of the i-th element of the interleaver permutation.

7. The method of claim 6 wherein the number of set flags in the first i flags of the reference vector is determined in part by determining a second number of flags set, the second number of flags set being the number of flags set in the reference vector in an interval from value of element i of the interleaver permutation to the value of element iD of the interleaver permutation.

8. The method of claim 7 wherein the number of set flags in the first i flags of the reference vector is the first number of flags plus the second number of flags.

9. The method of claim 7 wherein the number of set flags in the first i flags of the reference vector is the first number of flags minus the second number of flags.

10. The method of claim 5, wherein the number of set flags in the first i flags of the reference vector is determined using a second vector having NP integers, where P is less than 1, each integer representing the number of flags set in the reference vector in an interval between zero and i[1+L2/NP], where [1+L2/NP] is the integer part of [1+L2/NP], wherein L2 is the second threshold value.

11. The method of claim 2, further comprising:
setting a flag in an element of the reference vector corresponding to the each element invalidated in the interleaver permutation; and
compacting the interleaver permutation, wherein the process of compacting the interleaver permutation comprises discarding elements of the interleaver permutation having a value greater than K; and
wherein the process of accessing the interleaver permutation comprises determining whether each element of the interleaver permutation is valid by determining whether the corresponding flag of the reference vector is set.

12. The method of claim 1 wherein storing a value in an element of the reference vector corresponding to the value of the each element invalidated in the interleaver permutation comprises setting a value corresponding to the size of the interleaver permutation at which the element is invalidated.

13. The method of claim 12, further comprising scanning the interleaver permutation and determining whether each element of the interleaver permutation is valid, each element of the interleaver permutation is valid if the corresponding element of the reference vector has a value less than a predetermined interleaver size.

14. The method of claim 1 wherein at least one of the steps of invalidating the last element of the interleaver permutation comprises discarding the invalidated element.

15. A machine-readable storage medium that stores instructions for a processor, which when executed by the processor cause the processor to perform a method of pruning an S-random interleaver starting with an interleaver permutation having N elements and alternating between invalidating the last element of the interleaver permutation and invalidating the last element of a corresponding inverse interleaver permutation until the interleaver permutation has K elements, K being less than N, the method comprising storing a value in an element of the reference vector corresponding to the value of the each element invalidated in the iriterleaver permutation, the reference vector having N elements.

16. The machine-readable storage medium of claim 15 wherein the method further comprises:
updating a first threshold position indicating the last valid element of the interleaver permutation as elements of the interleaver permutation are invalidated;
updating a second threshold value indicating the last valid element of the inverse interleaver permutation as elements of the inverse interleaver permutation are invalidated; and
wherein storing a value in an element of the reference vector corresponding to the value of the each element invalidated in the interleaver permutation comprises setting a flag.

17. The machine-readable storage medium of claim 16 wherein the method further comprises normalizing the interleaver permutation using the reference vector, wherein the process of normalizing the interleaver permutation comprises:
setting DP equal to the number of elements to be discarded;
scanning the inverse interleaver permutation starting from the last valid element until DP=O, for each i, wherein i is an index of the elements in the reference vector, such that if the corresponding element of the reference vector is set:
subtracting DP from the element of the interleaver permutation addressed by the value of the inverse interleaver permutation indexed by i; and
decrementing DP by 1.

18. The machine-readable storage medium of claim 16 wherein the method further comprises compacting the interleaver permutation, wherein the process of compacting the interleaver permutation comprises discarding elements of the interleaver permutation having a value greater than K.

19. The machine-readable storage medium of claim 16 wherein the method further comprises normalizing the interleaver permutation using the reference vector, wherein the process of normalizing the interleaver permutation comprises, for each element of the interleaver permutation, decreasing the value of the i-th element of the interleaver permutation by the number of set flags in the first i flags of the reference vector, wherein i is an index of the elements of the reference vector.

20. The machine-readable storage medium of claim 16 wherein the number of set flags in the first i flags, wherein i is an index of the elements of the reference vector, of the reference vector is determined in part by determining a first number of flags set, the first number of flags set being the number of flags set in the first iD flags of the reference vector, where iD is the index of the element of the interleaver permutation having the closest value to the value of the i-th element of the interleaver permutation.

21. The machine-readable storage medium of claim 20 wherein the number of set flags in the first i flags of the reference vector is determined in part by determining a second number of flags set, the second number of flags set being the number of flags set in the reference vector in an interval from value of element of the interleaver permutation to the value of element iD of the interleaver permutation.

22. The machine-readable storage medium of claim 21 wherein the number of set flags in the first i flags of the reference vector is the first number of flags plus the second number of flags.

23. The machine-readable storage medium of claim 21 wherein the number of set flags in the first i flags of the reference vector is the first number of flags minus the second number of flags.

24. The machine-readable storage medium of claim 23, wherein the number of set flags in the first i flags of the reference vector is determined using a second vector having NP integers, where P is less than 1, each integer representing the number of flags set in the reference vector in an interval between zero and i[1+L2/NP], where [1+L2/NP] is the integer part of [1+L2/NP], wherein L2 is the second threshold value.

25. The machine-readable storage medium of claim 16 wherein the method further comprises:
setting a flag in an element of the reference vector corresponding to the each element invalidated in the interleaver permutation;
compacting the interleaver permutation, wherein the process of compacting the interleaver permutation comprises discarding elements of the interleaver permutation having a value greater than K; and
wherein the process of accessing the interleaver permutation comprises determining whether each element of the interleaver permutation is valid by determining whether the corresponding flag of the reference vector is set.

26. The machine-readable storage medium of claim 15 wherein storing a value in an element of the reference vector corresponding to the value of the each element invalidated in the interleaver permutation comprises setting a value corresponding to the size of the interleaver permutation at which the element is invalidated.

27. The machine-readable storage medium of claim 26 wherein the method further comprises scanning the interleaver permutation and determining whether each element of the interleaver permutation is valid, each element of the interleaver permutation is valid if the corresponding element of the reference vector has a value less than a predetermined interleaver size.

28. The machine-readable storage medium of claim 15 wherein at least one of the steps of invalidating the last element of the interleaver permutation comprises discarding the invalidated element.

29. A system for pruning an S-random interleaver comprising:
a first memory for storing a reference vector having N elements;
a second memory for storing an interleaver permutation having N elements and an inverse interleaver permutation corresponding to the interleaver permutation; and
a processor coupled to the first and second memory, the processor being configured to alternate between invalidating the last element of the interleaver permutation and invalidating the last element of a corresponding inverse interleaver permutation until the interleaver permutation has K elements, K being less than N, the processor being further configured to store a value in an element of the reference vector corresponding to the value of the each element invalidated in the interleaver permutation, the reference vector having N elements.

30. The system of claim 29 wherein the memory further comprises a first threshold position and a second threshold position, the processor being further configured to update the first threshold position indicating the last valid element of the interleaver permutation as elements of the interleaver permutation are invalidated, update a second threshold value indicating the last valid element of the inverse interleaver permutation as elements of the inverse interleaver permutation are invalidated, and set a flag in an element of the reference vector corresponding to the value of the each element invalidated in the interleaver permutation.

31. The system of claim 30 wherein the memory comprises a value in an element of the reference vector corresponding to the value of the each element invalidated in the interleaver permutation, the processor being configured to set a value corresponding to the size of the interleaver permutation at which the element is invalidated.

32. The system of claim 30, wherein the processor is further configured to scan the interleaver permutation and determine whether each element of the interleaver permutation is valid, each element of the interleaver permutation is valid if the corresponding element of the reference vector has a value less than a predetermined interleaver size.

* * * * *

UNITED STATES PATENT AND TRADEMARK OFFICE
CERTIFICATE OF CORRECTION

PATENT NO. : 7,568,145 B2  Page 1 of 1
APPLICATION NO. : 11/106474
DATED : July 28, 2009
INVENTOR(S) : Dinoi et al.

It is certified that error appears in the above-identified patent and that said Letters Patent is hereby corrected as shown below:

On the cover page,

[*] Notice: Subject to any disclaimer, the term of this patent is extended or adjusted under 35 U.S.C. 154(b) by 483 days Delete the phrase "by 483 days" and insert -- by 652 days --

Signed and Sealed this

Twenty-seventh Day of July, 2010

David J. Kappos
*Director of the United States Patent and Trademark Office*